United States Patent [19]

Okajima

[11] Patent Number: 4,744,060
[45] Date of Patent: May 10, 1988

[54] BIPOLAR-TRANSISTOR TYPE RANDOM ACCESS MEMORY HAVING REDUNDANCY CONFIGURATION

[75] Inventor: Yoshinori Okajima, Kawasaki, Japan

[73] Assignee: Fujitsu Limited, Kawasaki, Japan

[21] Appl. No.: 788,567

[22] Filed: Oct. 17, 1985

[30] Foreign Application Priority Data

Oct. 19, 1984 [JP] Japan .................. 59-218707
Nov. 20, 1984 [JP] Japan .................. 59-243340

[51] Int. Cl.$^4$ .............................................. G11C 7/00
[52] U.S. Cl. ...................................... 365/200; 365/230
[58] Field of Search ................ 365/200, 210, 230, 94, 365/96, 104; 371/10

[56] References Cited

U.S. PATENT DOCUMENTS 4,365,319  12/1982  Takemae .................... 365/200
4,399,372  8/1983  Tanimoto et al. .......... 365/200 X
4,592,024  5/1986  Sakai et al. ................. 365/200

Primary Examiner—Joseph A. Popek
Attorney, Agent, or Firm—Staas & Halsey

[57] ABSTRACT

A semiconductor memory device of a bipolar-transistor type including a memory cell array, a redundancy array, a defective address memory circuit for storing a defective address and a comparing circuit for comparing an input address with the defective address. The defective address memory circuit includes a plurality of information memory circuits. The information memory circuits include a plurality of diode stages for determining their output amplitudes. When an input address coincides with the defective address stored in the address memory circuit, the redundancy array is selected instead of the memory cell array.

30 Claims, 12 Drawing Sheets

BIPOLAR-TRANSISTOR TYPE RANDOM ACCESS MEMORY HAVING REDUNDANCY CONFIGURATION

BACKGROUND OF THE INVENTION

1. Field of the Invention

The present invention relates to a bipolar-transistor type random access memory (RAM) having a redundancy configuration. More particularly, the present invention is directed to a defective address memory portion of a RAM.

2. Description of the Related Art

In a RAM device, a large number of memory cells are arranged along rows and columns. The density of defects generated in such a semiconductor memory device during the manufacture thereof is relatively independent of the integration density of the device. The density of defects is due to semiconductor manufacturing technology. In general, the higher the integration density of the device, the greater the ratio of normal memory cells to defective memory cells. This is one of the advantages of increasing the integration density of a semiconductor memory device.

Even if a device includes only one defective memory cell, however, the device cannot be operated normally, and therefore, must be scrapped. As a result, despite the lower ratio of defective memory cells, greater integration density means reduced manufacturing yield.

In a metal-insulator-semiconductor (MIS) RAM, in order to overcome the problem of defective memory cells, use is made of redundancy memory cells. When a defective memory cell is detected, a redundancy memory cell row or column is selected instead of the memory cell row or column including the defective memory cell. In general, one or two redundancy memory cell rows or columns are usually provided.

In such a redundancy configuration, in order to store address information of such a defective row or column and to disable regular decoders so that the redundancy row or column is selected in response to an address of the defective row or column, a defective address memory circuit is required.

In the prior art, however, since there has been no preferable defective address memory circuit for a bipolar-transistor type RAM, there has been no bipolar-transistor type RAM having a redundancy configuration.

SUMMARY OF THE INVENTION

It is, therefore, an object of the present invention to provide a bipolar-transistor type RAM having a redundancy configuration.

It is another object of the present invention to provide a novel information memory circuit suitable for a defective address memory circuit of the bipolar-transistor type RAM having a redundancy configuration.

Accordingly, the present invention provides a semiconductor memory device of a bipolar-transistor type including a memory cell array, a redundancy array, a defective address memory circuit for storing a defective address, and a comparing circuit for comparing an input address with the defective address. The defective address memory circuit comprises a plurality of information memory circuits which includes a plurality of diode stages for determining output amplitudes of the information memory circuits. When an input address coincides with the defective address stored in the address memory circuit, the redundancy array is selected instead of the memory cell array.

According to the present invention, there is also provided an information memory circuit including at least three diode stages connected in a forward bias direction between a first power supply $V_{CC}$ and a mode, a diode stage linked in a reverse bias direction between a write power supply $V_P$ and the first power supply $V_{CC}$, a shorted-junction type programmable read-only memory (PROM) cell linked between the write power supply $V_P$ and the node, and a switching element linked between the node and a second power supply $V_{EE}$. The circuit thereby generates a high or low potential at the node in accordance with the short-circuited or non-short-circuited state of the PROM cell.

In the above-mentioned information memory circuit, two diode stages can be provided instead of the three diode stages, and in this case, the diode along the reverse bias direction is changed by one resistor, or one diode stage connected in a forward bias direction is provided on the side of the first power supply $V_{CC}$.

According to the present invention, there is further provided an information memory circuit including at least three diode stages connected in a forward bias direction between the power supply $V_{CC}$ and a node $N_1$, a resistor linked between the node $N_1$ and the second power supply $V_{EE}$, and a diode stage linked between the nodes $N_1$ and $N_2$, and having the same conduction direction as the at least three diode stages. In addition, a resistor is linked between the node $N_2$ and the second power supply $V_{EE}$, and a diode stage is linked in a reverse bias direction between the first power supply $V_{CC}$ and the write power supply $V_P$. A short-circuited-junction type PROM cell PC is linked between the write power supply $V_P$ and the node $N_2$, and a switching element is linked between the node $N_2$ and the power supply $V_{EE}$. An output circuit is connected to the nodes $N_1$ and $N_2$, for detecting the difference in potential in accordance with the short-circuited or non-short-circuited state of the PROM cell.

In the above-mentioned information memory circuit, in order to separate the circuits for determining each potential at the nodes $N_1$ and $N_2$, three diode stages are added to the node $N_2$. Also, the diode between the power supply $V_{CC}$ and the write power supply $V_P$ can be replaced by a resistor, and one stage of the three diode stages can be omitted. In addition, the diode stage between the power supply $V_{CC}$ and the write power supply $V_P$ can be deleted, however, a diode stage is provided on the power supply $V_{CC}$.

According to the above-mentioned configuration, if the short-circuited junction type PROM cell is not destroyed, the potential at the node $N_1$ is low. On the other hand, if the short-circuited junction type PROM cell is destroyed, the potential at the node $N_1$ is high. The data of the PROM cell can be read out by detecting the potential at the node $N_1$. Note that the difference in potential at the node $N_1$ between the non-destroyed state and destroyed state of the PROM cell corresponds to the forward direction potential of one diode stage.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
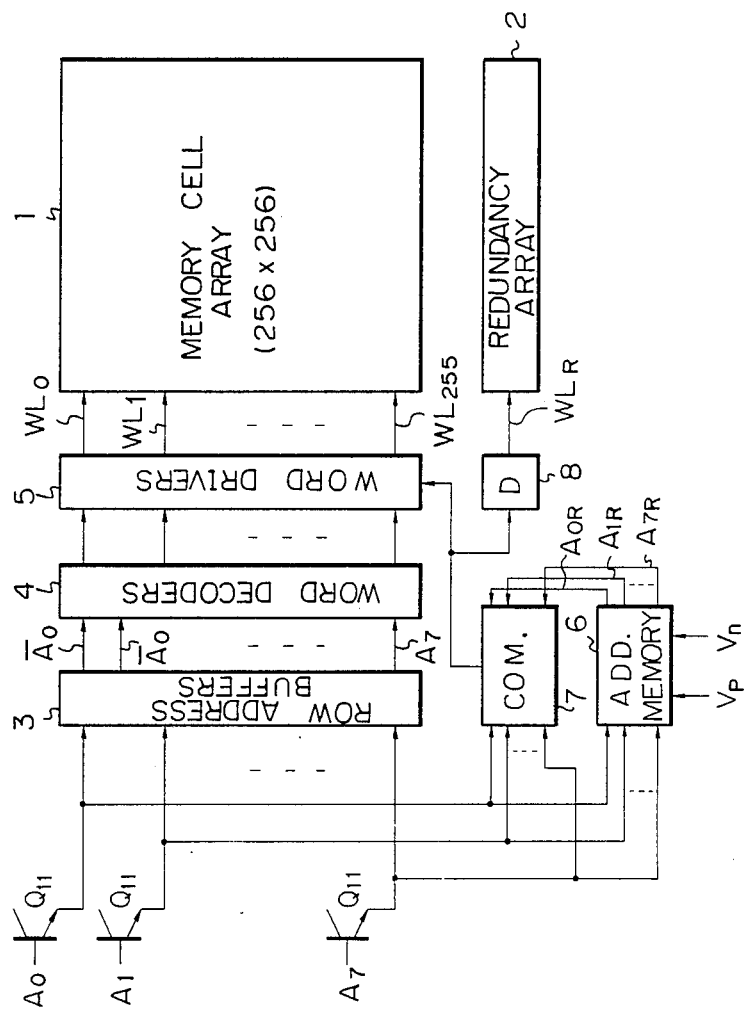
FIG. 1 is a block diagram of an embodiment of the semiconductor device of a bipolar-transistor type having a redundancy configuration according to the present invention.

In FIG. 1, which is an embodiment of the present invention, reference numeral 1 designates a 64K static memory cell array, and 2 designates a redundancy array. Note that the redundancy array can be comprised of more than two rows or columns, however, in this case, a one-row array is described to simplify the explanation. One row of the memory cell array 1 is selected by row address buffers 3, word decoders 4, and word drivers 5. That is, external row address signals $A_0$, $A_1$, ..., $A_7$ are received by emitter-followers $Q_{11}$ and are converted by the row address buffers 3 into internal row address signals $A_0$, $A_1$, ..., and $A_7$, and their inverted signals $\overline{A_0}$, $\overline{A_1}$, ..., and $\overline{A_7}$, which are received by the word decoders 4 which drive one of the 256 word drivers 5, i.e., one of the word lines $WL_0$, $WL_1$, ..., $WL_{255}$. Similarly, one column of the memory cell array 1 is selected by a column selection means (not shown).

In FIG. 1, reference 6 designates a defective address memory circuit, 7 is an address comparing circuit for comparing an input address defined by the external address signals $A_0$, $A_1$, ..., and $A_7$ with the defective address defined by signals $A_{0R}$, $A_{1R}$, ..., and $A_{7R}$ stored in the defective address memory circuit 6, and 8 is a driver circuit for driving the redundancy array 2.

If all the memory cells are normal, no problem occurs, and accordingly, the circuit of FIG. 1 operates in the same way as the conventional devices. However, if a defective cell is detected in the memory cell array 1 of FIG. 1, a row address of a row including the defective cell (hereinafter, referred to as a defective row address) is written into the defective address memory circuit 6. The row address signals $A_0$, $A_1$, ..., and $A_7$ are always compared with the defective address signals $A_{0R}$, $A_{1R}$, ..., and $A_{7R}$ written into the address memory circuit 6. As a result, when the row address signals $A_0$, $A_1$, ..., and $A_7$ coincide with the defective row address signals $A_{0R}$, $A_{1R}$, ..., and $A_{7R}$, respectively, the address comparing circuit 7 operates the driver 8 to select the word line $WL_R$ and drive the redundancy array 2, and simultaneously to disable the word drivers 5, thereby causing a non-selection of the memory cell array 1.

Figure 2:
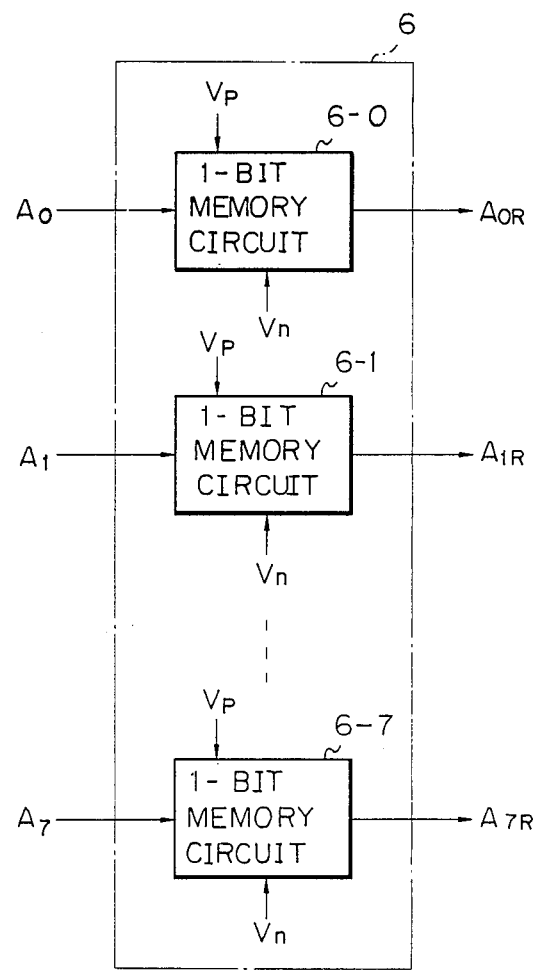
FIG. 2 is a block circuit diagram of the address memory circuit of FIG. 1.

In FIG. 2, which is a detailed block diagram of the defective address memory circuit 6 of FIG. 1, the circuit 6 comprises 1-bit memory circuits 6-0, 6-1, ..., and 6-7 corresponding to each of the row address signals $A_0$, $A_1$, ..., and $A_7$. That is, the row address signals $A_0$, $A_1$, ..., and $A_7$ are applied thereto, a high voltage such as +5 V is applied as a write voltage to the write terminal $V_P$, and a low voltage such as −5 V is applied to the other terminal $V_n$. Then, the row address signals $A_0$, $A_1$, ..., and $A_7$ are written into the 1-bit memory circuits 6-0, 6-1, ..., and 6-7, respectively. Thus, these signals can be read out as the defective address signals, ..., $A_{0R}$, $A_{1R}$, ..., and $A_{7R}$.

Hereinafter, the 1-bit memory circuits will be explained in more detail.

Figure 3:
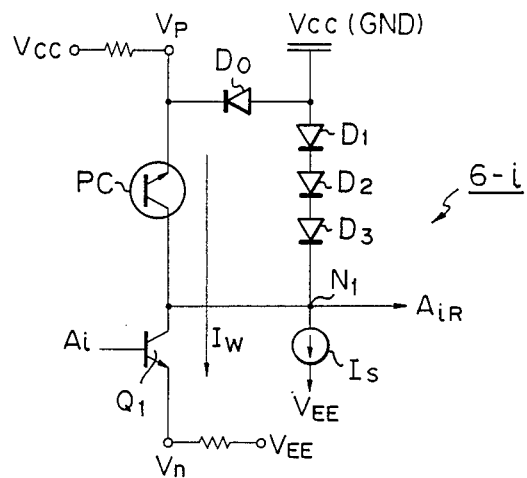
FIGS. 3 through 10 are circuit diagrams of the 1-bit memory circuit of FIG. 2.

In FIG. 3, which is a first example of the 1-bit memory circuit of FIG. 2, a power supply $V_{CC}$ is, for example, ground level GND, and a power supply $V_{EE}$ is, for example, −5 V. If in a write mode for breaking down the PROM cell PC, the write power supply $V_P$ is +5 V, otherwise $V_P$ equals $V_{CC}$ (GND). Also, if in a write mode, the write power supply $V_n$ is lower than −5 V, otherwise $V_n$ equals $V_{EE}$ (−5 V). Further, PC designates a short-circuited junction type PROM Cell which has diode characteristics after a write mode. That is, during a write mode, a larger voltage than the endurance voltage $C_E$ of the PROM cell, which is a type of transistor, is applied to the emitter-collector, thereby breaking it down.

Provided between the power supply $V_{CC}$ and node $N_1$ is a series of three diode stages $D_1$, $D_2$, and $D_3$, and a current source $I_S$, which generates a voltage at node $N_1$ for a non-broken mode. In this case, the diode stages $D_1$, $D_2$, and $D_3$ are forward biased. That is, the potential at node $N_1$ is $$-0.8 \times 3 = -2.4 \text{ V}$$

and is determined by the diode stages $D_1$, $D_2$, and $D_3$. Here, note that 0.8 V is the forward voltage of one diode stage. Also, in order to determine the potential at node $N_1$ after a writing node for the PROM cell PC, diode stage $D_0$ is provided between the power supply $V_{CC}$ and the write power supply $V_P$. The diode stage $D_0$ is reverse biased during a write mode. After a write mode, since the PROM cell PC serves as a diode stage, the potential at node $N_1$ is the voltage corresponding to two diode stages, i.e., $$-0.8 \times 2 = -1.6 \text{ V}.$$

Thus, in the circuit of FIG. 3, during a non-write (non broken-down) mode of the PROM cell PC, the potential at node $N_1$ is −2.4 V, and after a write mode, the potential at node $N_1$ is −1.6 V. Thus, the difference of 0.8 V in the potential is generated at node $N_1$. Note that a transistor $Q_1$ is used for a write operation of the PROM cell PC.

Next, the write operation of the circuit of FIG. 3 will be explained. In order to carry out a write operation, the write power supply $V_P$ is raised to +5 V from the exterior, while the write power supply $V_n$ is retained at −5 V. At this time, when the address signal $A_i$ is at a high level the write transistor $Q_1$ is turned ON. The duration voltage $C_E$ is approximately 7 V. As a result, a voltage higher than the duration voltage $C_E$ (which is, in this case, about 10 V) is applied to the PROM cell PC, and accordingly, a current $I_W$ flows through the emitter-collector of the PROM cell PC, thereby breaking down the emitter-base thereof.

Figure 4:
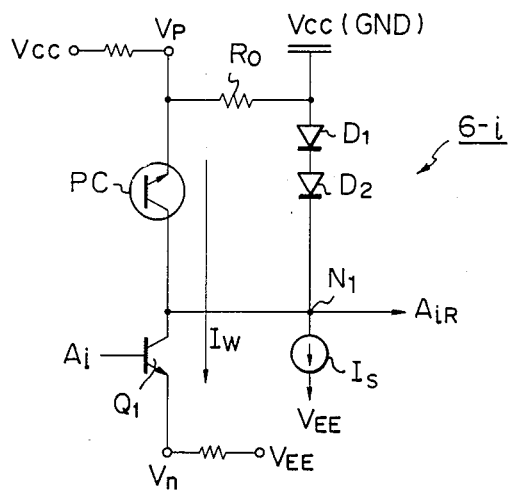

In FIG. 4, which is a second example of the 1-bit memory circuit of FIG. 2, the diode stages $D_0$ and $D_3$ of FIG. 3 are deleted, and a resistor $R_0$ is provided between the power supplies $V_{CC}$ and $V_P$. Note that the value of the resistor $R_0$ is relatively small. Therefore, the potential at node $N_1$ for a non-broken-mode is $$-0.8 \times 2 = -1.6 \text{ V}$$

and is determined by the diodes $D_1$ and $D_2$, and the potential at node $N_1$ after a write operation is $-0.8$ V. Thus, also in the circuit of FIG. 4, a difference in potential of 0.8 V is generated at node $N_1$.

Figure 5:
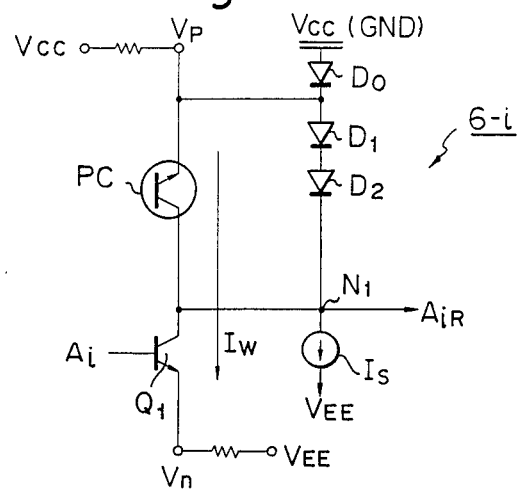

In FIG. 5, which is a third example of the 1-bit memory circuit of FIG. 2, the resistor $R_0$ of FIG. 4 is deleted, and a diode $D_0$ is provided on the side of the power supply $V_{CC}$. However, the operation of the circuit of FIG. 5 is approximately the same as that of FIG. 4.

In FIGS. 3, 4, and 5, a resistor can be provided instead of the current source $I_S$.

Figure 6:
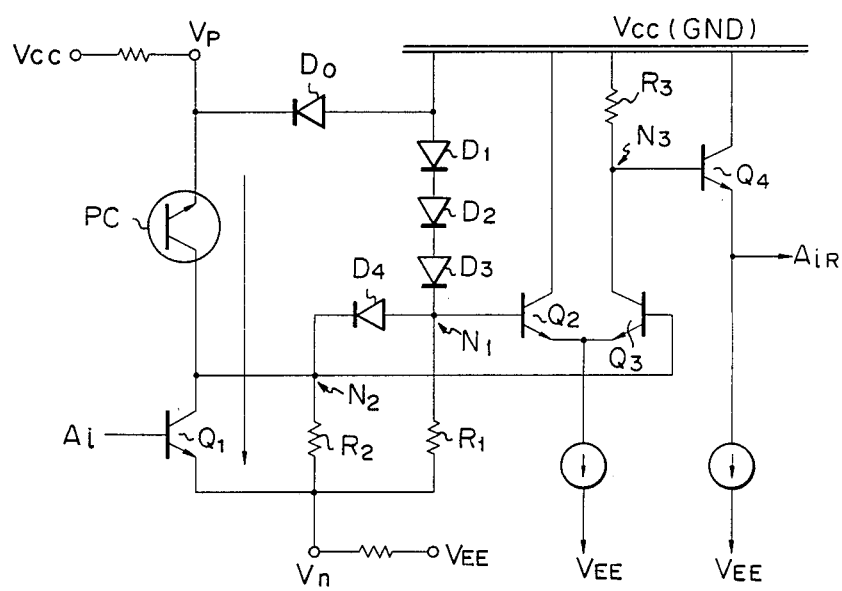

In FIG. 6, which is a fourth example of the 1-bit memory circuit of FIG. 2, provided between the power supplies $V_{CC}$ and $V_n$ is a series circuit formed by three diode stages $D_1$, $D_2$, and $D_3$, and resistors $R_1$ and $R_2$ for generating a reference voltage. That is, the potential at node $N_1$ is the reference voltage which equals $$-0.8 \times 3 = -2.4 \text{ V}$$

and is determined by the diode stages $D_1$, $D_2$, and $D_3$. Also, in order to determine the potential at node $N_2$ during a non-broken-mode of the PROM cell PC, a diode $D_4$ and the resistor $R_2$ are added to the diodes $D_1$, $D_2$, and $D_3$ between the power supplies $V_{CC}$ and $V_n$. That is, in this case, the potential at node $N_2$ is $$-0.8 \times 4 = -3.2 \text{ V}$$

and is determined by the diodes $D_1$, $D_2$, $D_3$, and $D_4$. Also, in this case, the potential at node $N_2$ after a write operation is $$-0.8 \times 2 = -1.6 \text{ V}$$

and is determined by the diode stage $D_0$ and the PROM cell PC. Thus, in the circuit of FIG. 6, during a non-broken-mode of the PROM cell PC, the potential at node $N_1$ is $-2.4$ V, and the potential at node $N_2$ is $-3.2$ V. As a result, among transistors $Q_2$ and $Q_3$ which form a current switch, the transistor $Q_2$ is turned ON, while the transistor $Q_3$ is turned OFF, and therefore, the potential at node $N_3$ becomes at a high level ($V_{CC}$). Thus, as the base potential of an output transistor $Q_4$ increases, the potential of the defective address signal $A_{iR}$ becomes high. On the other hand, after a write mode of the PROM cell PC, the potential at node $N_1$ is $-2.4$ V, and the potential at node $N_2$ is $-1.6$ V. As a result, among the transistors $Q_2$ and $Q_3$ forming a current switch, the transistor $Q_2$ is turned OFF, while the transistor $Q_3$ is turned ON, and therefore, the potential at node $N_3$ becomes a low level. Thus, as the base potential of the output transistor $Q_4$ decreases, the potential of the defective address signal $A_{iR}$ becomes low.

Figure 7:
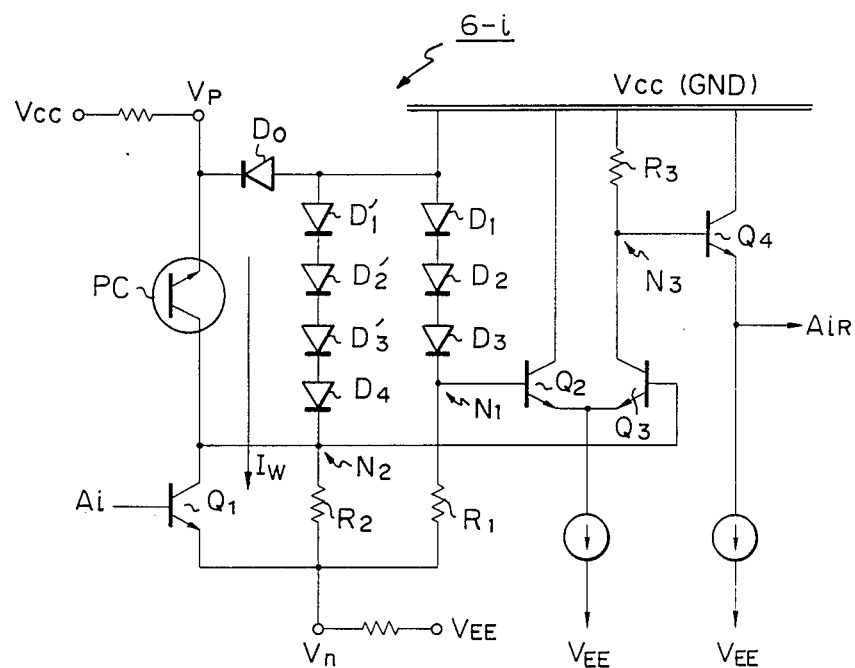

In FIG. 7, which is a fifth example of the 1-bit memory circuit of FIG. 2, in order to separate the circuit for determining the potential at node $N_1$ from the circuit for determining the potential at node $N_2$ during a non-broken-mode, three diode stages $D_1'$, $D_2'$, and $D_3'$ are provided. However, the operation of the circuit of FIG. 7 is the same as that of FIG. 6.

Thus, in the circuits of FIGS. 6 and 7, the potential at node $N_2$ is increased or decreased by the potential corresponding to one diode stage as compared with the reference voltage at node $N_1$, in accordance with the presence or absence of a write operation (breakdown) of the PROM cell PC. Also, the logic amplitude corresponding to one diode stage is read out by the following transistors $Q_2$, $Q_3$, and $Q_4$.

Figure 8:
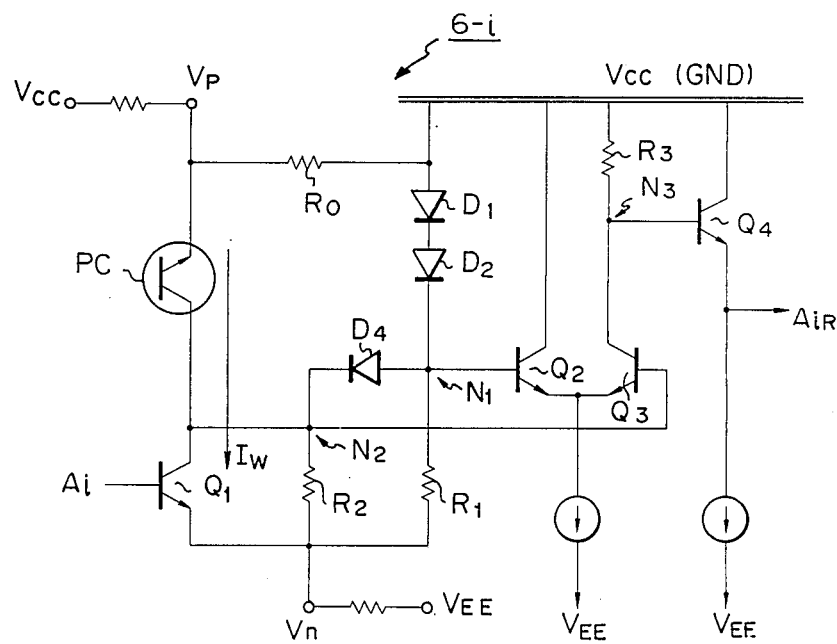

In FIG. 8, which is a sixth example of the 1-bit memory circuit of FIG. 2, the diode $D_3$ of FIG. 6 is deleted, and a resistor $R_0$ is provided between the power supplies $V_{CC}$ and $V_P$. Note that the value of the resistor $R_0$ is relatively small. Therefore, the reference voltage potential at node $N_1$ is $$-0.8 \times 2 = -1.6 \text{ V}$$

and is determined by the diodes $D_1$ and $D_2$. The potential at node $N_2$ during a non-broken-mode of the PROM cell PC is $$-0.8 \times 3 = -2.4 \text{ V}$$

and is determined by the diodes $D_1$, $D_2$, and $D_4$. The potential at node $N_2$ after a write mode of the PROM cell PC is $$-0.8 \text{ V}$$

and is determined by the PROM cell PC which corresponds to one diode stage. Thus, after a write mode of the PROM cell PC, the potential at node $N_1$ is $-1.6$ V; and the potential at node $N_2$ is $-2.4$ V. Thus, in the same manner as in the circuit of FIG. 6, the potential of the defective address signal $A_{iR}$ is high. On the other hand, after a write mode of the PROM cell PC, the potential at node $N_1$ is $-1.6$ V; and the potential at node $N_2$ is $-0.8$ V. Thus, in the same manner as in the circuit of FIG. 6, the potential of the defective address signal $A_{iR}$ is low.

Figure 9:
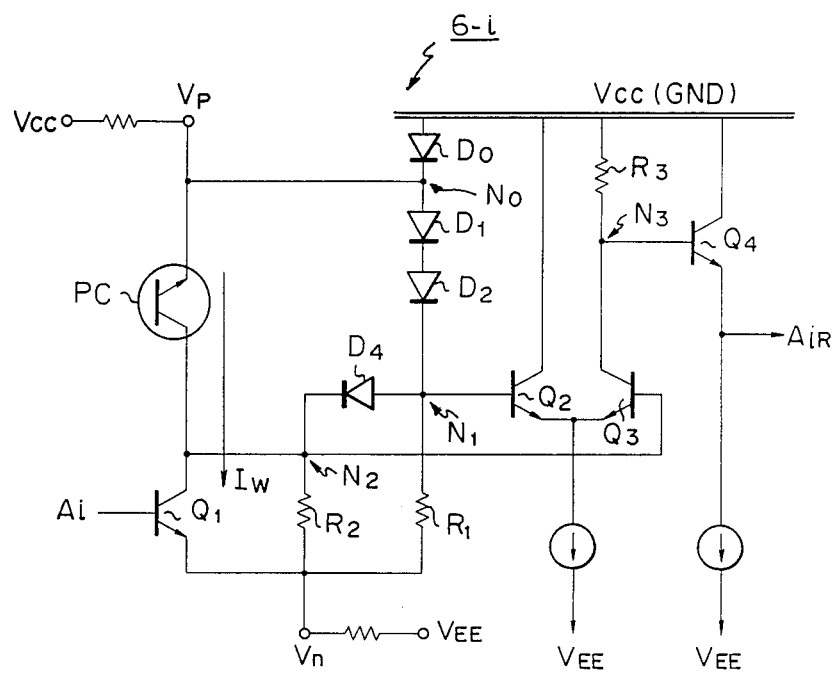

In FIG. 9, which is a seventh example of the 1-bit memory circuit of FIG. 2, the resistor $R_0$ of FIG. 8 is deleted, and a diode $D_0$ is provided on the side of the power supply $V_{CC}$. However, the operation of the circuit of FIG. 9 is similar to that of FIG. 8.

Figure 10:
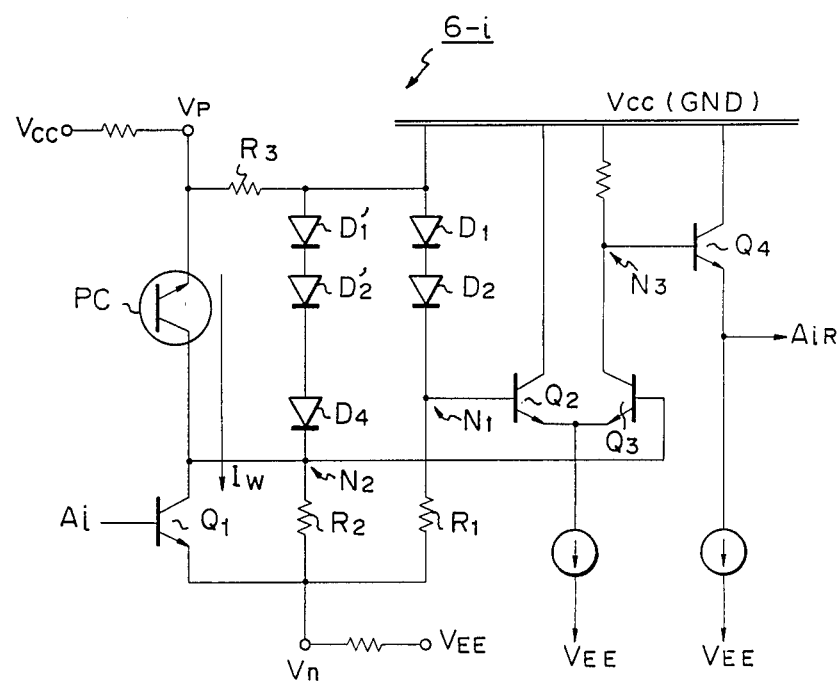

In FIG. 10, which is an eighth example of the 1-bit memory circuit of FIG. 2, in order to separate the circuit for determining the potential at node $N_1$ from the circuit for determining the potential at node $N_2$, two diode stages $D_1'$ and $D_2'$ are added. However, the operation of the circuit of FIG. 10 is the same as that of FIG. 8.

Thus, in the circuits of FIGS. 8, 9, and 10, the potential at node $N_2$ is increased or decreased by the potential corresponding to one diode stage as compared with the reference voltage at node $N_1$, in accordance with the presence or absence of a write operation (breakdown) of the PROM cell PC. Also, the logic amplitude corresponding to one diode stage is read out by the following transistors $Q_2$, $Q_3$, and $Q_4$.

Figure 11A:
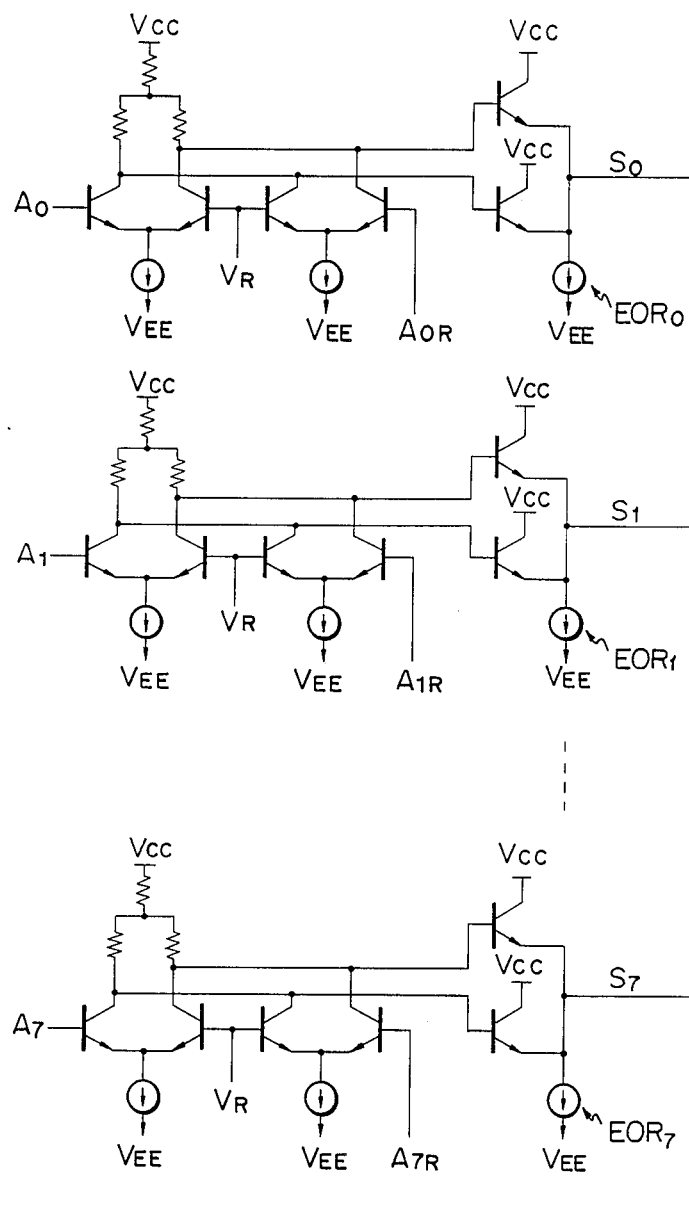
FIGS. 11A and 11B are circuit diagrams of the comparing circuit of FIG. 2.
Figure 11B:
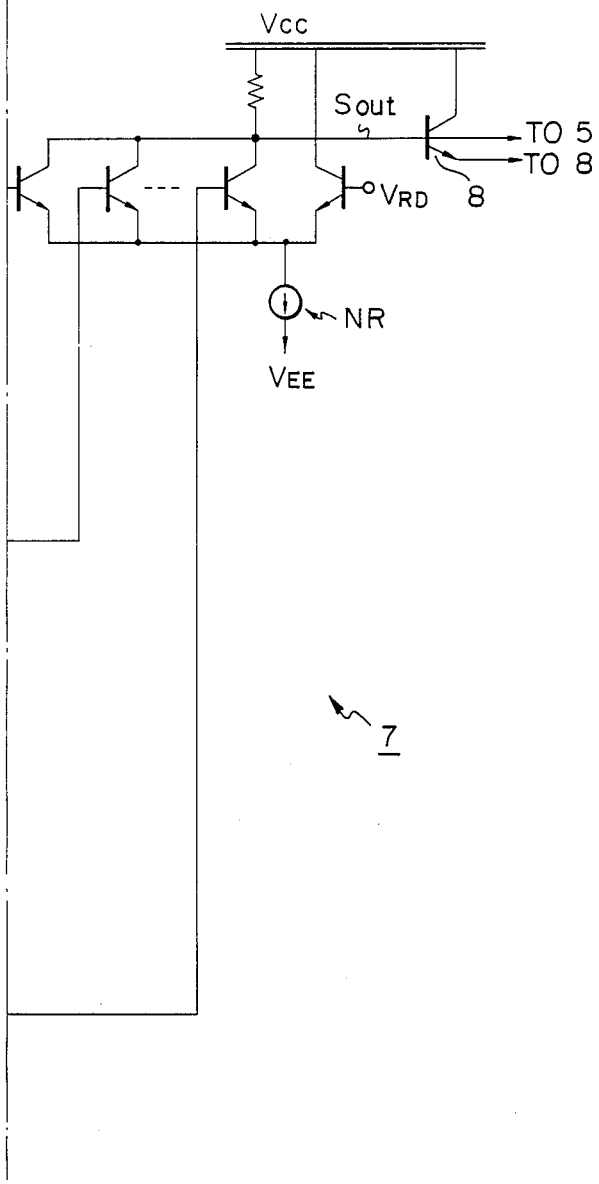

The output $A_{iR}$ of the circuit of FIGS. 3, 4, 5, 6, 7, 8, 9, or 10 is supplied to the address comparing circuit 7 of FIG. 1. As illustrated in FIGS. 11A and 11B, the address comparing circuit 7 comprises eight exclusive OR circuits $EOR_0$, $EOR_1$, ..., $EOR_7$, and a NOR circuit NR. When the address signals $A_0$, $A_1$, ..., and $A_7$ coincide with the defective address signals $A_{0R}$, $A_{1R}$, ..., and $A_{7R}$, the outputs $S_0$, $S_1$, ..., and $S_7$ of the exclusive OR circuits $ERO_0$, $EOR_1$, ..., and $EOR_7$ are all low, so that the output $S_{out}$ of the NOR circuit NR becomes high, thereby operating the driver 8, and, simultaneously, disabling the word drivers 5. On the other hand, when at least one bit of the address signals $A_0$, $A_1$, ..., and $A_7$ does not coincide with a corresponding one of the defective address signals $A_{0R}, A_{1R}, \ldots,$ and $A_{7R}$, at least one of the outputs $S_0, S_1, \ldots,$ and $S_7$ of the exclusive OR circuits $EOR_0, EOR_1, \ldots,$ and $EOR_7$ is high, so that the output $S_{out}$ of the NOR circuit NR becomes low, thereby disabling the driver 8, and, simultaneously, enabling the word drivers 5.

In FIG. 11, note that $V_R$ is a reference voltage, which is predetermined as suitable for the logic amplitude of the defective address memory circuit 6-i. For example, in the case of the circuit in FIGS. 3 or 5, $V_R$ is approximately $-2.0$ V, while in the case of the circuit as illustrated in FIG. 4, $V_R$ is about $-1.2$ V. Also, $V_{RD}$ of FIG. 11 is a predetermined reference voltage.

Note that the number of diode stages ($D_1, D_2,$ and $D_3$) of FIGS. 3 through 10 can be increased. However, in FIG. 7 (or 10), when the number of diode stages $D_1$ to $D_3$ (or $D_1$ and $D_2$) is increased, the number of diode stages $D_1'$ to $D_3'$ (or $D_1'$ and $D_2'$) must also be increased.

In the 1-bit memory circuits in FIGS. 3 through 10, the logic amplitude is defined by the number of diode stages. Accordingly, such circuits are helpful in the configuration of the defective address memory circuit for storing a defective address in a bipolar-transistor type RAM having a redundancy configuration.

However, in the case of a write operation in the circuits of FIGS. 3 through 10, a very large write current $I_W$ is necessary, and as a result, the write transistor $Q_1$ becomes large and also its load becomes large. Therefore, in FIG. 1, when the address signals $A_0, A_1, \ldots,$ and $A_7$ having a large logic amplitude are supplied directly to the row address buffers 3 and to the defective address memory circuit 6, the large load of the write transistor $Q_1$ is also applied to the address signals $A_0, A_1, \ldots,$ and $A_7$ even during a non-write mode. This causes a problem wherein an address access time is delayed during a normal state.

Figure 12A:
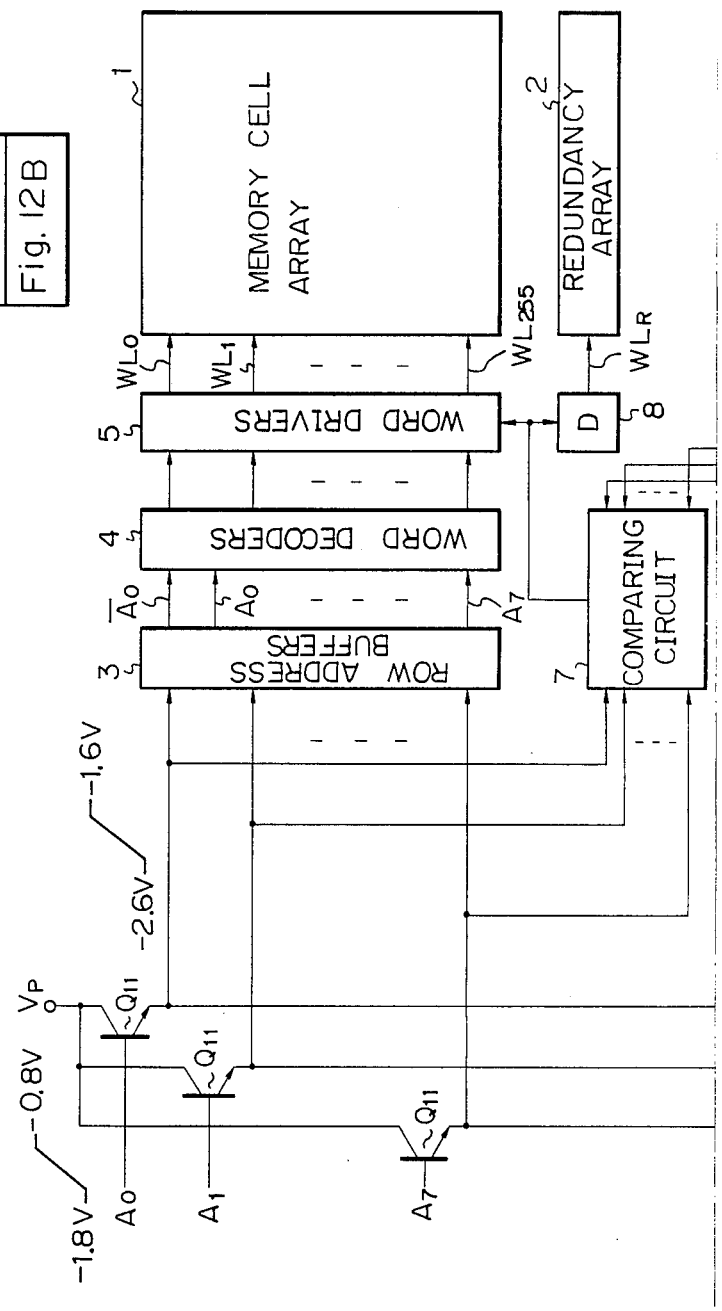
FIGS. 12A and 12B are circuit diagrams of another embodiment of the semiconductor memory device of a bipolar-transistor type having a redundancy configuration according to the present invention.
Figure 12B:
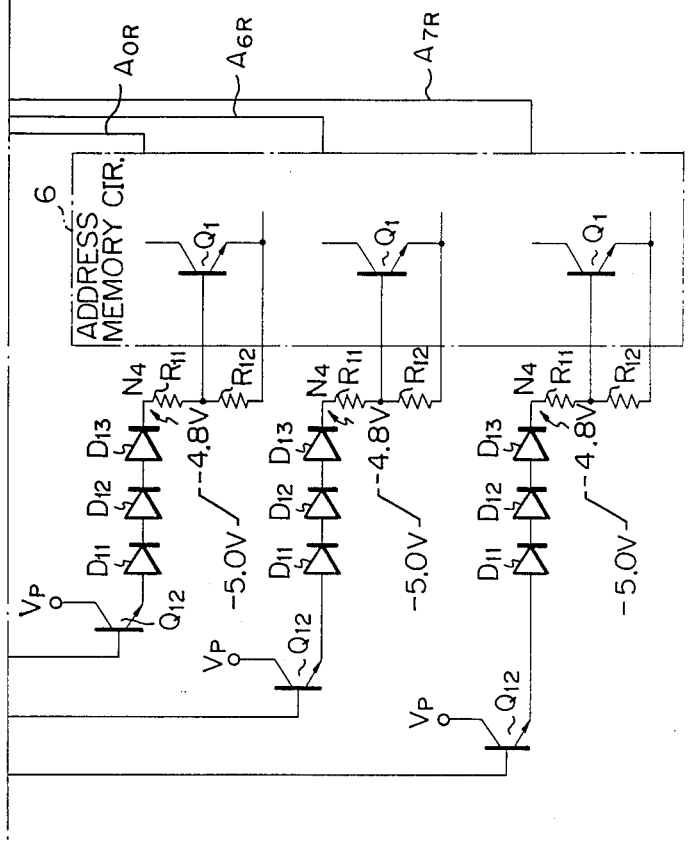

In FIGS. 12A and 12B, which are another embodiment of the present invention, each of the row address signals $A_0, A_1, \ldots,$ and $A_7$ are supplied via emitter-follower transistors $Q_{11}$ and $Q_{12}$, diodes $D_{11}, D_{12},$ and $D_{13}$, and resistors $R_{11}$ and $R_{12}$ to the defective address memory circuit 6. For example, if the high and low levels of an address signal are $-0.8$ V and $-1.8$ V, respectively, the address amplitude is 1.0 V (i.e., $1.8-0.8$), and therefore, the high and low levels at the inputs of the row address buffers 3 are $-1.6$ V (i.e., $-0.8-0.8$) and $-2.6$ (i.e., $-1.8-0.8$), respectively, and the address amplitude is also 1.0 V. On the other hand, at each node $N_4$ on the input side of the defective address memory circuit 6, the high level $-0.8$ V of the address signals $A_0, A_1, \ldots,$ and $A_7$ becomes $$-1.8 - 0.85 \times 5 = -5.8 \text{ V}$$

and is determined by two stages of the emitter-follower transistors $Q_{11}$ and $Q_{12}$ and three stages of the diodes $D_{11}, D_{12},$ and $D_{13}$. In this case, since the lowest power supply voltage is $-5.0$ V, the low level at each node $N_3$ is $-5.0$ V. Therefore, the address amplitude at each node $N_3$ is small and is 0.2 V (i.e., $5.0-4.8$). The address amplitude of the gates of the write transistors $Q_1$ is further decreased by resistors $R_{11}$ and $R_{12}$. For example, when the address amplitude is at the gates of the write transistors $Q_1$, the address amplitude is reduced $0.1/1 = 1/10$ by the two stages of the emitter-follower transistors, the three stages of the diodes, and the resistors.

Thus, during a non-write mode, since the address amplitude input to the defective address memory circuit 6 is reduced as compared with the address amplitude input to the row address buffers 3, application of a large load of the write transistors $Q_1$ can be substantially avoided. That is, even when the gate capacity $C_G$ of the transistor $Q_1$ is large, the fluctuation of charges $C_G \Delta V$ is reduced if the voltage amplitude $\Delta V$ is reduced. Thus, the load of the write transistors can be neglected.

During a write mode, since the voltage $V_P$ is increased from 0 V to 5 V, the address amplitude at the write transistors $Q_1$ becomes large, and in this case, the address amplitude at the address buffers 3 also increases. This, however, has no effect on the address buffers 3 during a write mode.

Note that, in FIG. 12, two stages of emitter-followers, three stages of diodes, and the like are used as the level shift means. The number of stages, however, can be modified as occasion demands or in accordance with the power supply voltage. For example, all the five stages may consist of diodes. Also, if the write voltage is high, the number of stages can be more than six. Further, if the lowest power supply voltage is higher than $-5$ V, the number of stages can be less than four.

Thus, in FIGS. 12A and 12B, during a non-write mode, since the address amplitude applied to the write transistors $Q_1$ can be reduced, the large load of these write transistors is not applied to the address signals, and as a result, the address access time can be reduced.

What is claimed is:

1. A semiconductor memory device including bipolar-transistors, comprising:
   a memory cell array;
   a redundancy memory cell array;
   means for receiving an address signal;
   means, operatively connected between said means for receiving an address signal and said memory cell array, for selecting a memory cell from said memory cell array in accordance with said address signal from said address receiving means;
   means, operatively connected to said means for receiving an address signal, for storing a defective address of a defective memory cell of said memory cell array, said defective address storing means comprising a plurality of 1-bit memory circuits of a diode type, each circuit corresponding to each bit of said defective address; and
   means, operatively connected to said means for storing a defective address and said means for receiving an address signal, for comparing said address signal from said means for receiving an address signal with said defective address from said means for storing a defective address so as to disable said memory cell selecting means and for selecting said redundancy memory cell array when said address signal coincides with said defective address.

2. A device as set forth in claim 1, wherein each of said 1-bit memory circuits comprises:
   first power supply means;
   second power supply means;
   write power supply means;
   at least three diode stages connected in a forward bias direction between said first power supply means second power supply means;

current means connected between said at least three diode stages and said second power supply means, the connection of said current means and said at least three diode stages forming a node therebetween;

a diode stage connected in a reverse bias direction between said write power supply means and said first power supply means;

a short-circuited junction type PROM cell connected between said write power supply means and said node and having a short circuited and non-short circuited state; and a switching element, connected between said node and said second power supply means, for receiving one bit of said address signal and for generating a high or low potential at said node in accordance with the short-circuited or non-short-circuited state of said PROM cell.

3. A device as set forth in claim 2, wherein said current means comprises a current source.

4. A device as set forth in claim 2, wherein said current means comprises a resistor.

5. A device as set forth in claim 1, wherein each of said 1-bit memory circuits comprises:
first power supply means;
second power supply means;
write power supply means;
a first diode stage connected in a forward bias direction between said first power supply means and said second power supply means;
a second diode stage including at least two diode stages connected in a forward bias direction between said first diode stage and said second power supply means;
current means connected between said second diode stage and said second power supply means, the connection of said current means and said second diode stage forming a node therebetween;
a short-circuited junction type PROM cell connected between said write power supply means and said node and having a short-circuited and non-short-circuited state; and
a switching element, connected between said node and said second power supply means, for receiving one bit of said address signal and for generating a high or low potential at said node in accordance with the short-circuited or non-short-circuited state of said PROM cell.

6. A device as set forth in claim 5, wherein said current means comprises a current source.

7. A device as set forth in claim 5, wherein said current means comprises a resistor.

8. A device as set forth in claim 1, wherein each of said 1-bit memory circuits comprises:
first power supply means;
second power supply means;
write power supply means;
a first diode stage including at least three diode stages connected in a forward bias direction between said first power supply means and said second power supply means;
a first resistor connected between said first diode stage and said second power supply means, the connection of said first resistor and said first diode stage forming a first node therebetween;
a second diode stage connected between said first node and said second power supply means, and having the same conduction direction as said first diode stage;
a second resistor connected between said second diode stage and said second power supply means, the connection of said second diode stage and said resistor forming a second node therebetween;
a third diode stage connected in a reverse bias direction between said first power supply means and said write power supply means;
a short-circuited junction type PROM cell connected between said write power supply means and said second node and having a short-circuited and non-short-circuited state;
a switching element, connected between said second node and said second power supply means, for receiving one bit of said address signal; and
output means, connected between said first and second nodes and said first and second power supply means, for detecting the difference in potential in accordance with the short-circuited or non-short-circuited state of said PROM cell.

9. A device as set forth in claim 1, wherein each of said 1-bit memory circuits comprises:
first power supply means;
second power supply means;
write power supply means;
a first diode stage including at least three diode stages connected in a forward bias direction between said first power supply means and said second power supply means;
a first resistor connected between said first diode stage and said second power supply means, the connection of said first diode and said first resistor forming a first node therebetween;
a second diode stage including at least four diodes stages connected in a forward bias direction between said first power supply means and said second power supply means;
a second resistor connected between said second diode stage and said second power supply means, the connection of said second diode stage and said second resistor forming a second node therebetween;
a third diode stage connected in a reverse bias direction between said first power supply means and said write power supply means; and
a short-circuited-junction type PROM cell connected between said write power supply means and said second node and having a short-circuited and non-short-circuited state;
a switching element, connected between said second node and said second power supply means, for receiving one bit of said address signal; and
output means, connected between said first and second nodes and said first and second power supply means, for detecting the difference in potential in accordance with the short-circuited or non-short-circuited state of said PROM cell.

10. A device as set forth in claim 1, wherein each of said 1-bit memory circuits comprises:
first power supply means;
second power supply means;
write power supply means;
a first diode stage including at least two diode stages connected in a forward bias direction between said first power supply means and said second power supply means;

a first resistor connected between said first diode stage and said second power supply means, the connection of said first resistor and said first diode stage forming a first node therebetween;

a second diode stage connected to said first node, and having the same conduction direction as said first diode stage;

a second resistor connected between said second diode stage and said second power supply means, the connection of said second diode stage and said second power supply means forming a second node therebetween;

a resistor connected between said first power supply means and said write power supply means;

a short-circuited-junction type PROM cell connected between said write power supply means and said second node and having a short-circuited state and non-short-circuited state;

a switching element, connected between said second node and said second power supply means, for receiving one bit of said address signal; and output means, connected between said first and second nodes and said first and second power supply means, for detecting the difference in potential in accordance with the short-circuited or non-short-circuited state of said PROM cell.

11. A device as set forth in claim 1, wherein each of said 1-bit memory circuits comprises:

first power supply means;
second power supply means;
write power supply means;

a first diode stage connected in a forward bias direction to said first power supply means;

a second diode stage including at least two diode stages connected to said first diode stage in a forward bias direction, forming a first node therebetween;

a first resistor connected between said second diode stage and said second power supply means, the connection of said first resistor and said second diode stage forming a second node therebetween;

a third diode stage connected to said second node, and having the same conduction direction as said second diode stage;

a second resistor connected between said third diode stage and said second power supply means, the connection of said second resistor and said third diode stage forming a third node therebetween;

a short-circuited junction type PROM cell connected between said write power supply means and said third node and having a short-circuited and non-short-circuited state;

a switching element, connected between said third node and said second power supply means, for receiving one bit of said address signal; and output means connected between said second and third nodes and said first and second power supply means, for detecting the difference in potential in accordance with the short-circuited or non-short-circuited state of said PROM cell.

12. A device as set forth in claim 1, wherein each of said 1-bit memory circuits comprises:

first power supply means;
second power supply means;
write power supply means;

a first diode stage including at least two diode stages connected in a forward bias direction to said first power supply means;

a first resistor connected between said first diode stage and said second power supply means, the connection of said first resistor and said first diode stage forming a first node therebetween;

a second diode stage including at least three diode stages connected in a forward bias direction to said first power supply means;

a second resistor connected between said second diode stage and said second power supply means, said connection of said second resistor and said second diode stage forming a second node therebetween;

a third resistor connected between said first power supply means and said write power supply means;

a short-circuited junction type PROM cell connected between said write power supply means and said second node and having a short-circuited and non-short-circuited state;

a switching element, connected between said second node and said second power supply means, for receiving one bit of said address signal; and output means, connected to said first and second nodes, for detecting the difference in potential in accordance with the short-circuited or non-short-circuited state of said PROM cell.

13. An information memory device comprising:

first power supply means;
second power supply means 1
write power supply means;

a first diode stage including at least three diodes stages connected in a forward bias direction between said first power supply means and said second power supply means;

current means connected between said first diode stage and said second power supply means, the connection of said current source and said first diode stage forming a node therebetween;

a second diode stage connected in a reverse bias direction between said write power supply means and said first power supply means;

a short-circuited-junction type PROM cell connected between said write power supply means and said node and having a short-circuited and non-short-circuited state; and a switching element, connected between said node and said second power supply means for generating a high or low potential at said node in accordance with the short-circuited or non-short-circuited state of said PROM cell.

14. A device as set forth in claim 13, wherein said current means comprises a current source.

15. A device as set forth in claim 13, wherein said current means comprises a resistor.

16. An information memory device comprising:

first power supply means;
second power supply means;
write power supply means;

a first diode stage including at least two diode stages connected in a forward bias direction between said first power supply means and said second power supply means;

current means connected between said first diode stage and said second power supply means, the connection of said current means and said first diode stage forming a node therebetween;

a resistor connected between said write power supply means and said first power supply means;

a short-circuited-junction type PROM cell connected between said write power supply means and said node and having a short-circuited and non-short-circuited state; and a switching element, connected between said node and said second power supply means, for generating a high or low potential at said node in accordance with the short-circuited or non-short-circuited state of said PROM cell.

17. An information memory device comprising:
first power supply means;
second power supply means;
write power supply means;
a first diode stage connected in a forward bias direction to said first power supply means;
a second diode stage including at least two diode stages connected in a forward bias direction between said first diode stage and said second power supply means, the connection of said first diode stage and said second diode stage forming a first node therebetween, the connection of said second diode stage and said second power supply means forming a second node therebetween;
current means connected between said second node and said second power supply means;
a short-circuited junction type PROM cell connected between said write power supply means and said second node and having a short-circuited state and non-short-circuited state; and
a switching element, connected between said second node and said second power supply means for generating a high or low potential at said second node in accordance with the short-circuited or non-short-circuited state of said PROM cell.

18. A device as set forth in claim 17, wherein said current means comprises a current source.

19. A device as set forth in claim 17, wherein said current means comprises a resistor.

20. An information memory device comprising:
first power supply means;
second power supply means;
write power supply means;
a first diode stage including at least three diode stages connected in a forward bias direction to said first power supply means;
a first resistor connected between said first diode stage and said second power supply means, the connection of said first diode stage and said first resistor forming a first node therebetween;
a second diode stage connected to said first node, and having the same conduction direction as said first diode stage;
a second resistor connected between said second diode stage and said second power supply means, the connection of said second diode stage and said second resistor forming a second connection node therebetween;
a third diode stage connected in a reverse bias direction between said first power supply means and said write power supply means;
a short-circuited junction type PROM cell connected between said write power supply means and said second node and having a short-circuited state and non-short-circuited state;
a switching element connected between said second node and said second power supply means; and
output means, connected between said first and second nodes, for detecting the difference in potential in accordance with the short-circuited or non-short-circuited stage of said PROM cell.

21. An information memory device comprising:
first power supply means;
second power supply means;
write power supply means;
a first diode stage including at least three diode stages connected in a forward bias direction to said first power supply means and said first node;
a first resistor connected between said first diode stage and said second power supply means, the connection of said first diode stage and said first resistor forming a first node therebetween;
a second diode stage including at least four diodes connected in a forward bias direction to said first power supply means;
a second resistor connected between said second diode stage and said second power supply means, the connection of said second diode stage and said second resistor forming a second node therebetween;
a third diode stage connected in a reverse bias direction between said first power supply means and said write power supply means;
a short-circuited junction type PROM cell connected between said write power supply means and said second node and having a short-circuited state and non-short-circuited state;
a switching element, connected between said second node and said second power supply means; and
output means, connected between said first and second nodes and said first and second power supply means, for detecting a potential difference in accordance with the short-circuited or non-short-circuited state of said PROM cell.

22. An information memory device comprising:
first power supply means;
second power supply means;
write power supply means;
a first diode stage including at least two diode stages connected in a forward bias direction to said first power supply means;
a first resistor connected between said first diode stage and said second power supply means, the connection of said first resistor and said first diode stage forming a first node therebetween;
a second diode stage connected to said first node, and having the same conduction direction as said first diode stage;
a second resistor connected between said second diode stage and said second power supply means, the connection of said second diode stage and said second resistor forming a second node therebetween;
a resistor connected between said first power supply means and said write power supply means;
a short-circuited junction type PROM cell connected between said write power supply means and said second node and having a short-circuited state and non-short-circuited state;
a switching element, connected between said second node and said second power supply means; and
output means, connected between said first and second nodes, for detecting a difference in potential in accordance with the short-circuited or non-short-circuited state of said PROM cell.

23. An information memory device comprising:
first power supply means;

second power supply means;
write power supply means;
a first diode stage connected in a forward bias direction to said first power supply means;
a second diode stage including at least two diode stages connected in a forward bias direction to said first diode stage, forming a first connection node therebetween;
a first resistor connected between said second diode stage and said second power supply means, the connection of said second diode stage and said first resistor forming a second node therebetween;
a third diode stage connected to said second node, and having the same conduction direction as said second diode stage;
a second resistor connected between said third diode stage and said second power supply means, the connection of said third diode stage and said second resistor forming a third node therebetween;
a short-circuited junction type PROM cell connected between said write power supply means and said third node and having a short-circuited state and non-short-circuited state;
a switching element, connected between said third node and said second power supply means; and
output means, connected between said second and third nodes and said first and second power supply means, for detecting a difference in potential in accordance with the short-circuited or non-short-circuited state of said PROM cell.

24. An information memory device comprising:
first power supply means;
second power supply means;
write power supply means;
a first diode stage including at least two diode stages connected in a forward bias direction to said first power supply means;
a first resistor connected between said first diode stage and said second power supply means, the connection of said first resistor and said first diode stage forming a node therebetween;
a second diode stage including at least three diode stages connected in a forward bias direction to said first power supply means;
a second resistor connected between said second diode stage and said second power supply means, the connection of said second diode stage and said second resistor forming a node therebetween;
a resistor connected in a reverse bias direction between said first power supply means and said write power supply means; and
a short-circuited junction type PROM cell connected between said write power supply means and said second node and having a short-circuited and non-short-circuited state;
a switching element, connected between said second node and said second power supply means; and
output means, connected between said first and second nodes and said first and second power supply means, for detecting the difference in potential in accordance with the short-circuited or non-short-circuited state of said PROM cell.

25. A semiconductor memory device including bipolar-transistors, comprising:
a memory cell array;
a redundancy memory cell array;
means for receiving an address signal;
means, operatively connected between said means for receiving an address signal and said memory cell array, for selecting a memory cell from said memory cell array in accordance with said address signal from said address receiving means;
means, operatively connected to said means for receiving an address signal, for storing a defective address of a defective memory cell of said memory cell array, said defective address storing means comprising a plurality of 1-bit memory circuits of a diode type, each circuit corresponding to each bit of said defective address, each of said 1-bit memory circuits including:
first power supply means;
second power supply means;
write power supply means;
at least two diode stages connected in a forward bias direction between said first power supply means and said second power supply means;
current means connected between said at least two diode stages and said second power supply means, the connection of said current means and said at least two diode stages forming a node therebetween;
a short-circuited junction type PROM cell connected between said write power supply means and said node and having a short-circuited and non-short-circuited state; and
a switching element, connected between said node and said second power supply means, for receiving one bit of said address signal, and for generating a high or low-potential at said node in accordance with the short-circuited or non-short-circuited state of said PROM cell; and
means, operatively connected to said means for storing a defective address and said means for receiving an address signal, for comparing said address signal from said means for receiving an address signal with said defective address from said means for storing a defective address and disabling said memory cell selecting means and for selecting said redundancy memory cell array when said address signal coincides with said defective address.

26. A device as set forth in claim 25, wherein said current means comprises a current source.

27. A device as set forth in claim 25, wherein said current means comprises a resistor.

28. A semiconductor memory device including bipolar-transistors, comprising:
a memory cell array;
a redundancy memory cell array;
means for receiving an address signal;
means, operatively connected between said means for receiving an address signal and said memory cell array, for selecting a memory cell from said memory cell array in accordance with said address signal from said address receiving means;
means, operatively connected to said means for receiving an address signal, for storing a defective address of a defective memory cell of said memory cell array, said defective address storing means comprising a plurality of 1-bit memory circuits of a diode type, each circuit corresponding to each bit of said defective address;
means, operatively connected to said means for storing a defective address and said means for receiving an address signal, for comparing said signal from said means for receiving an address signal with said defective address from said means for storing a defective address so as to disable said memory cell selecting means and for selecting said redundancy memory cell array when said address signal coincides with said defective address; and means, connected between said means for receiving an address signal and said means for storing a defective address, for transmitting said address signal to said means for storing a defective address during a defective address writing mode and hindering transmission of said address signal to said means for storing a defective address during a normal address writing mode.

29. A device as set forth in claim 28, further comprising switching means connected to said address receiving means and connected to receive the address signal, said switching means including:

level shift means for reducing the output amplitude of said address receiving means so that the input amplitude of said defective address storing means is smaller than the output amplitude of said defective address storing means.

30. A device as set forth in claim 29, wherein said level shift means includes one or more stages of emitter-followers, diodes, or resistors.

* * * * *

UNITED STATES PATENT AND TRADEMARK OFFICE
CERTIFICATE OF CORRECTION

PATENT NO. : 4,744,060
DATED : MAY 10, 1988
INVENTOR(S) : YOSHINORI OKAJIMA

It is certified that error appears in the above-identified patent and that said Letters Patent is hereby corrected as shown below:

Claim 13, Col. 12, line 28, "1" should be --;--.

Signed and Sealed this

Sixth Day of September, 1988

Attest:

DONALD J. QUIGG

Attesting Officer

Commissioner of Patents and Trademarks